(12) United States Patent
Lin et al.

(10) Patent No.: US 9,711,326 B1
(45) Date of Patent: Jul. 18, 2017

(54) TEST STRUCTURE FOR ELECTRON BEAM INSPECTION AND METHOD FOR DEFECT DETERMINATION USING ELECTRON BEAM INSPECTION

(71) Applicant: UNITED MICROELECTRONICS CORP., Hsin-Chu (TW)

(72) Inventors: Kuan-Chun Lin, Tainan (TW); Chih-Chieh Chou, Chiayi County (TW); Shih-Cheng Chen, Tainan (TW); Chung-Chih Hung, Kaohsiung (TW); Yung-Teng Tsai, Tainan (TW); Chi-Hung Chan, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/001,249

(22) Filed: Jan. 20, 2016

(51) Int. Cl.
*H01J 37/22* (2006.01)
*H01J 37/26* (2006.01)
*H01L 21/66* (2006.01)

(52) U.S. Cl.
CPC .......... *H01J 37/222* (2013.01); *H01J 37/263* (2013.01); *H01L 22/34* (2013.01); *H01J 2237/221* (2013.01); *H01J 2237/24592* (2013.01)

(58) Field of Classification Search
USPC .............. 438/14, 17, 18; 257/48, 347, 355; 324/752, 762.03
See application file for complete search history.

(56) References Cited

U.S. PATENT DOCUMENTS 8,299,463 B2    10/2012  Xiao
2009/0015285 A1*  1/2009  Farooq ............... G01R 31/2853
                                                            324/762.03

* cited by examiner

*Primary Examiner* — Kiet T Nguyen
(74) *Attorney, Agent, or Firm* — Winston Hsu

(57) ABSTRACT

A test structure for electron beam inspection and a method for defect determination using electron beam inspection are provided. The test structure for electron beam inspection includes a semiconductor substrate, at least two conductive regions disposed on the semiconductor substrate, a connection structure disposed on the two conductive regions, and a cap dielectric layer disposed on the connection structure. The method for defect determination using the electron beam inspection includes the following steps. An electron beam inspection is preformed to a test structure with an instant detector and a lock-in amplifier. Signals received by the detector within a period of time are amplified by the lock-in amplifier. A defect in the test structure is determined by monitoring the signals received by the detector and amplified by the lock-in amplifier. The inspection accuracy is improved by the test structure and the method for defect determination in the present invention.

4 Claims, 10 Drawing Sheets

TEST STRUCTURE FOR ELECTRON BEAM INSPECTION AND METHOD FOR DEFECT DETERMINATION USING ELECTRON BEAM INSPECTION

BACKGROUND OF THE INVENTION

1. Field of the Invention

The present invention relates to a test structure for electron beam inspection and a method for defect determination using electron beam inspection, and more particularly, to a test key structure having a cap dielectric layer disposed on a connection structure and a method for defect determination using a lock-in amplifier to amplify signals received by an instant detector.

2. Description of the Prior Art

Semiconductor integrated circuits undergo a variety of processing steps during manufacture, such as masking, resist coating, etching, and deposition. The interconnections between different material layers must be effective for properly operating the semiconductor device, and defects generated in the manufacturing processes have to be monitored for improving the manufacturing yield.

Recently, electron beam (e-beam) inspection (EBI) tool has been applied to detect defects in the semiconductor wafer. For example, voltage-contrast type defects, such as electrical shorts or opens at a contact or a void in the interconnections may be detected by the e-beam inspection tool. However, the e-beam inspection tool has very poor capability on high-resistance defect mode due to relatively weak signals from poor signal-to-noise ratio (S/N ratio) and small gray level value difference ($\Delta$GLV), and there is no other index for further judging the degree of the failure.

SUMMARY OF THE INVENTION

According to the claimed invention, a test structure for electron beam inspection is provided. The test structure includes a semiconductor substrate, at least two conductive regions, a connection structure, and a cap dielectric layer. The two conductive regions are disposed on the semiconductor substrate. The connection structure is disposed on the two conductive regions, and the cap dielectric layer is disposed on the connection structure.

According to the claimed invention, a method for defect determination using electron beam inspection is provided. The method for defect determination using the electron beam inspection includes the following steps. A test structure is provided. An electron beam inspection is performed to the test structure with an instant detector and a lock-in amplifier. Signals received by the detector within a period of time are amplified by the lock-in amplifier. A defect in the test structure is determined by monitoring the signals received by the detector and amplified by the lock-in amplifier.

According to the test structure for the electron beam inspection in the present invention, the cap dielectric layer is disposed on the connection structure connecting over the conductive regions. A capacitance may be formed by the cap dielectric layer and used in the electron beam inspection for improving the signal-to-noise ratio (S/N ratio) and the accuracy of the electron beam inspection.

According to the method for defect determination using the electron beam inspection in the present invention, the signals received by the detector within a period of time are amplified by the lock-in amplifier, and the signal-to-noise ratio and the accuracy of the electron beam inspection may be enhanced accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
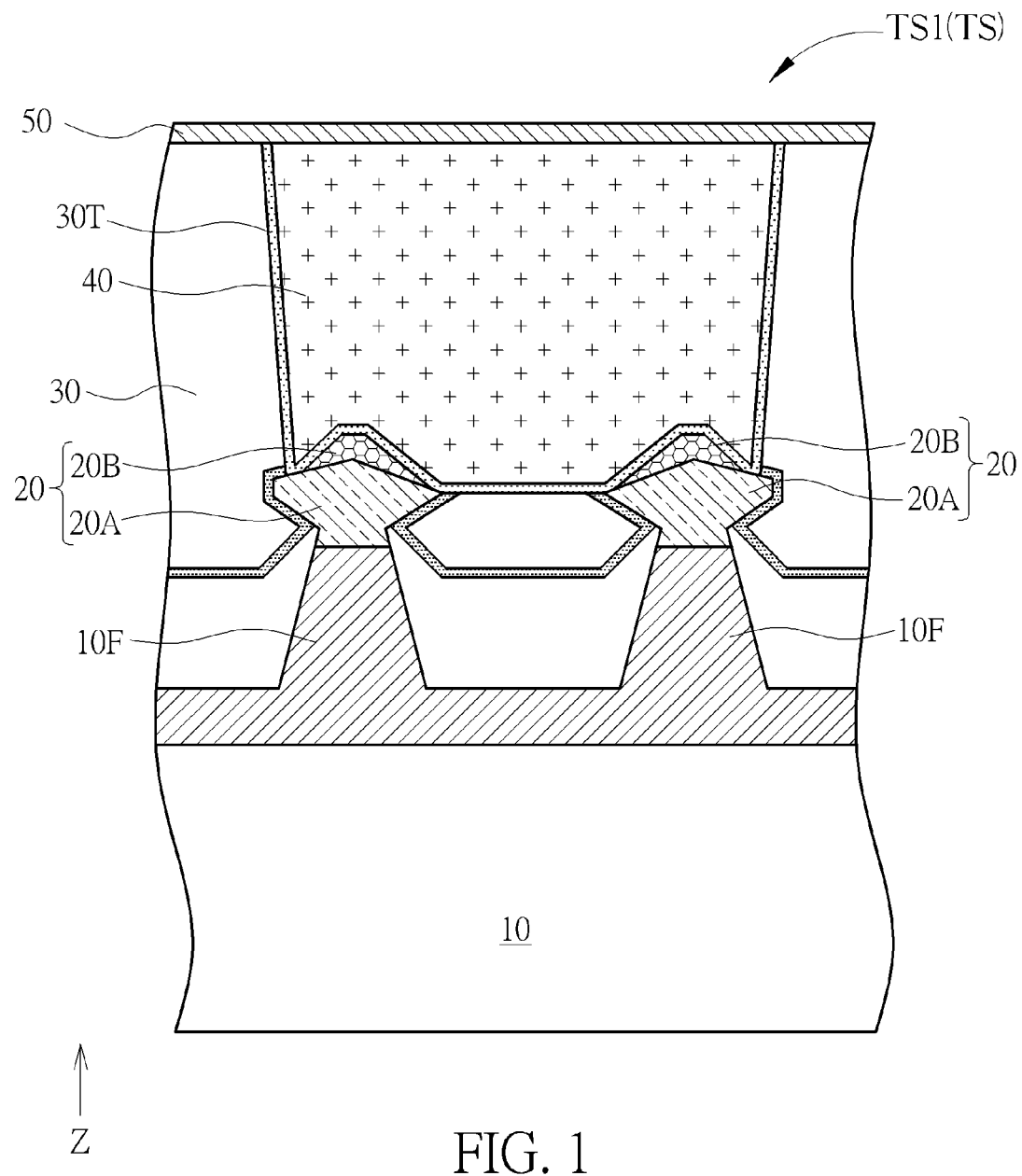
FIG. 1 is a schematic drawing illustrating a test structure for electron beam inspection according to a first embodiment of the present invention.

Please refer to FIG. 1. FIG. 1 is a schematic drawing illustrating a test structure for electron beam inspection according to a first embodiment of the present invention. As shown in FIG. 1, a test structure TS for electron beam inspection is provided in this embodiment. The test structure TS includes a semiconductor substrate 10, at least two conductive regions 20, a connection structure 40, and a cap dielectric layer 50. The two conductive regions 20 are disposed on the semiconductor substrate 10. The connection structure 40 is disposed on the two conductive regions 20 for electrically connecting the two conductive regions 20, but the present invention is not limited to this. In other embodiments of the present invention, there may be more than two conductive regions 20 disposed in the test structure, and the connection structure 40 may be configured to electrically connect more than two conductive regions 20. The cap dielectric layer 50 is disposed on the connection structure 40. In this embodiment, the semiconductor substrate 10 may include a silicon substrate, an epitaxial silicon substrate, a silicon germanium substrate, a silicon carbide substrate, or a silicon-on-insulator (SOI) substrate, but not limited thereto. The semiconductor substrate 10 may also have a plurality of fin structures 10F, each of the conductive regions 20 may be formed on one of the fin structures 10F, and the connection structure 40 may be used to electrically connect the conductive regions 20 on different fin structures 10F, but not limited thereto. Specifically, each of the conductive regions 20 may include a doped region 20A, such as a doped epitaxial region, or other suitable doped region formed on the fin structure 10F. The epitaxial region mentioned above may include a silicon germanium (SiGe) epitaxial region, a silicon phosphorus (SiP) epitaxial region, a silicon carbide (SiC) epitaxial region, or other suitable epitaxial regions for different design considerations.

Additionally, each of the conductive regions 20 may further include a metal silicide 20B disposed on the doped region 20A, and the metal silicide 20B may include titanium silicide (TiSi$_x$) or other appropriate metal silicide materials. A dielectric layer 30 may be formed to cover the fin structures 10F and the conductive regions 20, and a trench 30T may be formed to penetrate the dielectric layer 30 and/or other material layers covering the conductive regions 20 for exposing at least a part of each conductive region 20. The connection structure 40 may be formed in the trench 30T and contact the conductive regions 20 for forming an electrical connection, and the connection structure 40 may include a slot contact disposed in the dielectric layer 30, but not limited thereto. The connection structure 40 may include metal conductive materials such as aluminum (Al), tungsten (W), copper (Cu), titanium aluminide (TiAl), titanium (Ti), titanium nitride (TiN), tantalum (Ta), tantalum nitride (TaN), and titanium aluminum oxide (TiAlO) or other suitable conductive materials. The dielectric layer 30 may include silicon oxide, silicon nitride, silicon oxynitride, or other suitable insulating materials. The cap dielectric layer 50 may be formed to cover the connection structure 40 and the dielectric layer 30 in a vertical direction Z, and the cap dielectric layer 50 may include a nitrogen doped carbide (NDC) layer or other suitable dielectric materials. In this embodiment, the test structure TS may be a dummy test key simulating the corresponding interconnection in a semiconductor device, but not limited thereto. By using the test structure TS in this embodiment, a capacitance may be formed by the cap dielectric layer 50 and used in an electron beam inspection for improving the signal-to-noise ratio (S/N ratio) and the accuracy of the electron beam inspection, and the detail content of the corresponding operation of the electron beam inspection will be described in subsequent embodiments.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
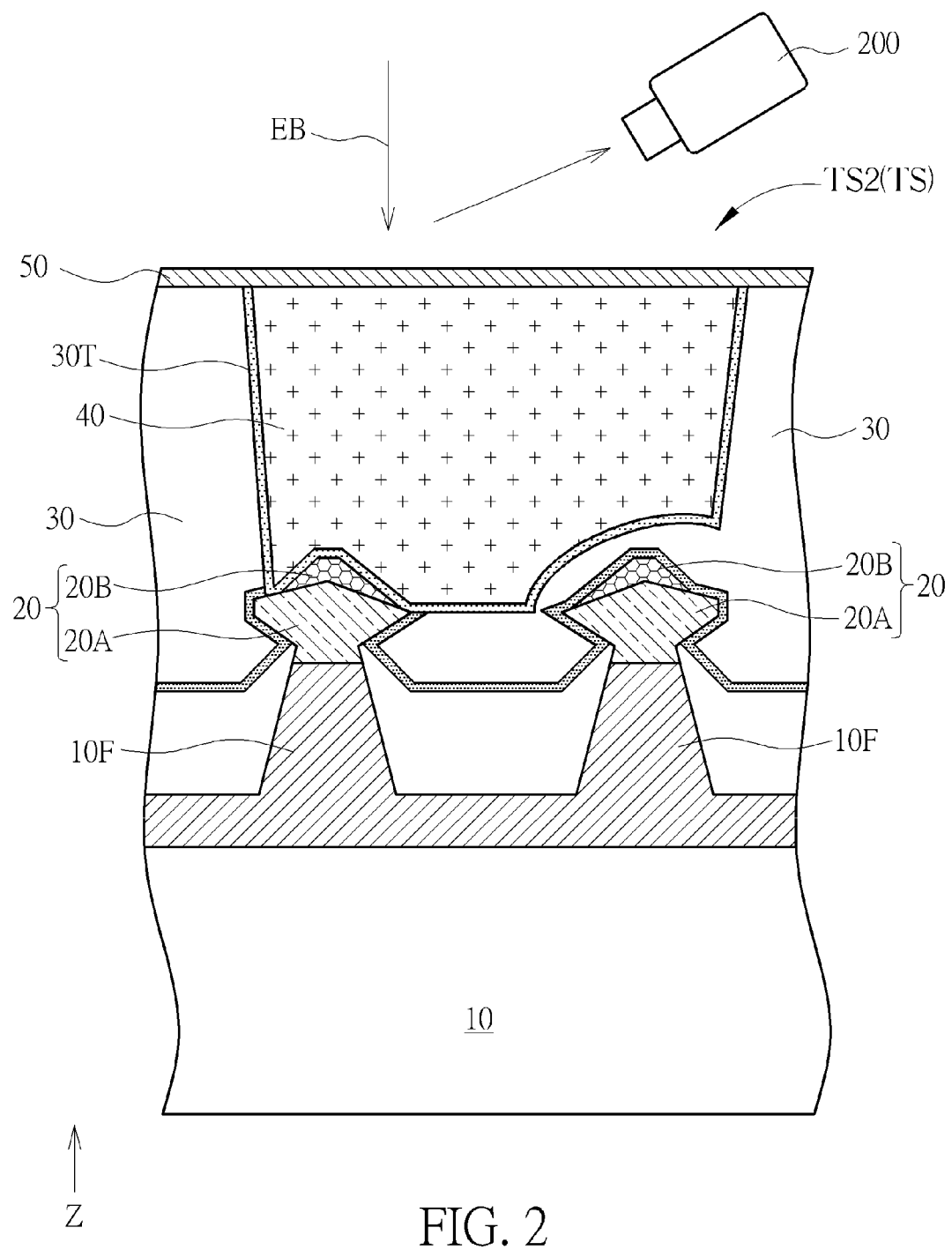
FIG. 2 is a schematic drawing illustrating a method for defect determination using electron beam inspection according to a comparative embodiment of the present invention.

Please refer to FIG. 1 and FIG. 2. FIG. 2 is a schematic drawing illustrating a method for defect determination using electron beam inspection according to a comparative embodiment of the present invention. As shown in FIG. 1 and FIG. 2, the test structure TS shown in FIG. 1 may be regarded as a normal test structure TS1, and a test structure TS shown in FIG. 2 may be regarded as an abnormal test structure TS2. The difference between the abnormal test structure TS2 and normal test structure TS1 is that the connection structure 40 is separated from one of the conductive regions 20 by the dielectric layer 30, and the connection structure 40 fails to electrically connect the two conductive regions 20. In this comparative embodiment, a method for defect determination using electron beam inspection is performed to the test structure TS. In the method of this comparative embodiment, an electron beam EB is used to apply negative charges on the surface of the test structure TS, and a detector 200 scan the surface of the test structure TS for monitoring the voltage contrast (VC) level from a charged particle microscopic image generated by signal received by the detector 200. Theoretically, when one of the connection conditions underneath the connection structure 40 is different from the others (such as the disconnection between the connection structure 40 and the right conductive region 20 shown in FIG. 2), different voltage contrast images may be observed. However, due to many problems such as relatively weak signals from poor signal-to-noise ratio (S/N ratio) and small gray level value difference (ΔGLV), it is hard to determine the high-resistance defect and the degree of the failure cannot be obtained by the method in this comparative embodiment.

Figure 3:
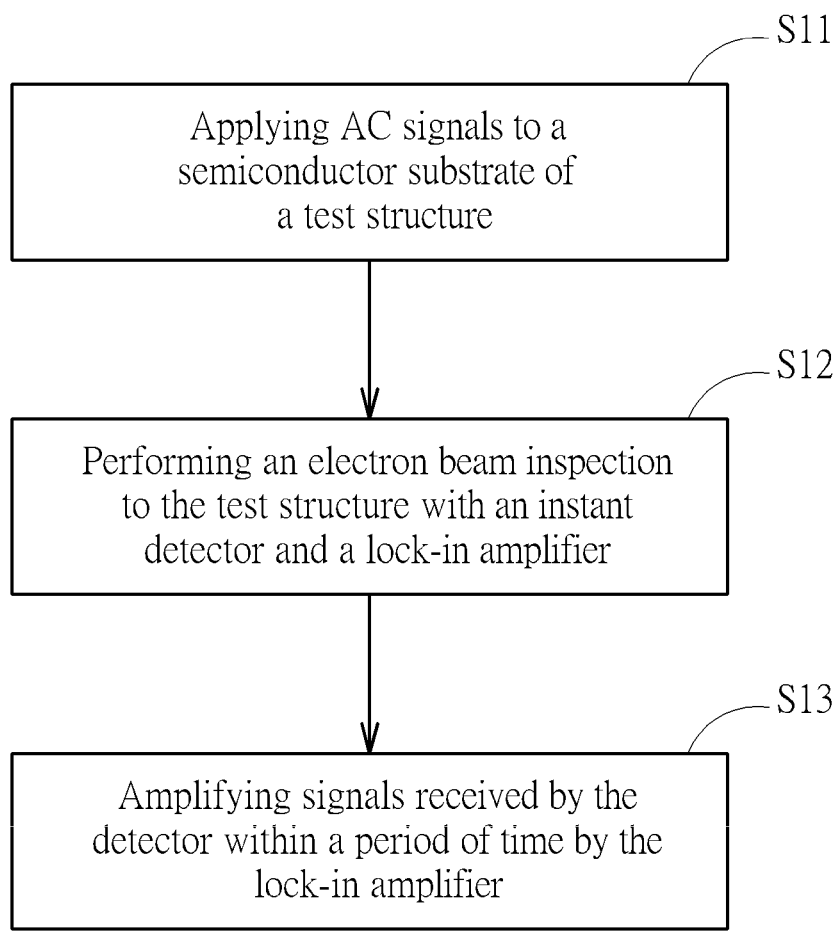
FIG. 3 is a flow chart of a method for defect determination using electron beam inspection according to a second embodiment of the present invention.
Figure 4:
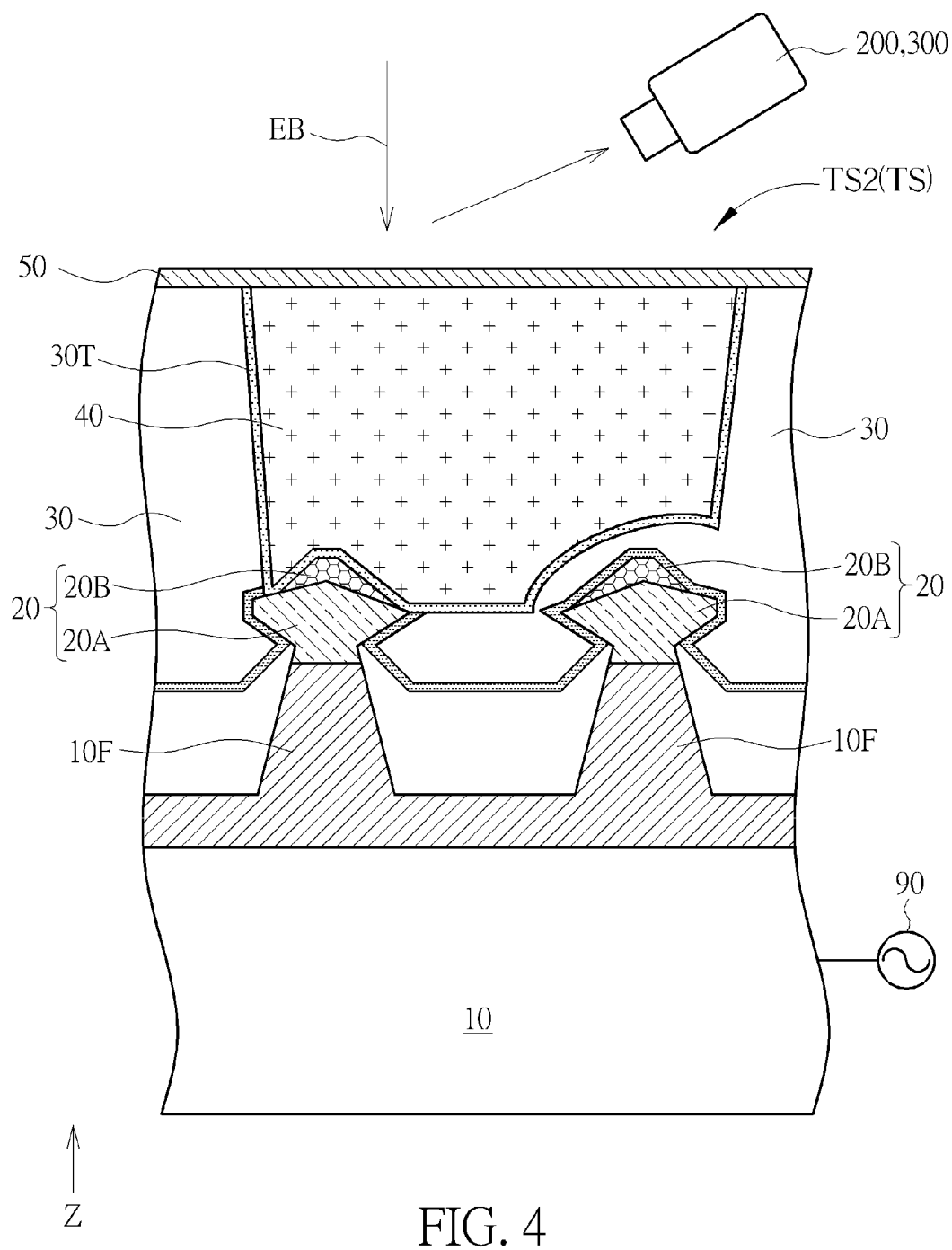
FIG. 4 is a schematic drawing illustrating the method for defect determination using the electron beam inspection according to the second embodiment of the present invention.
Figure 5:
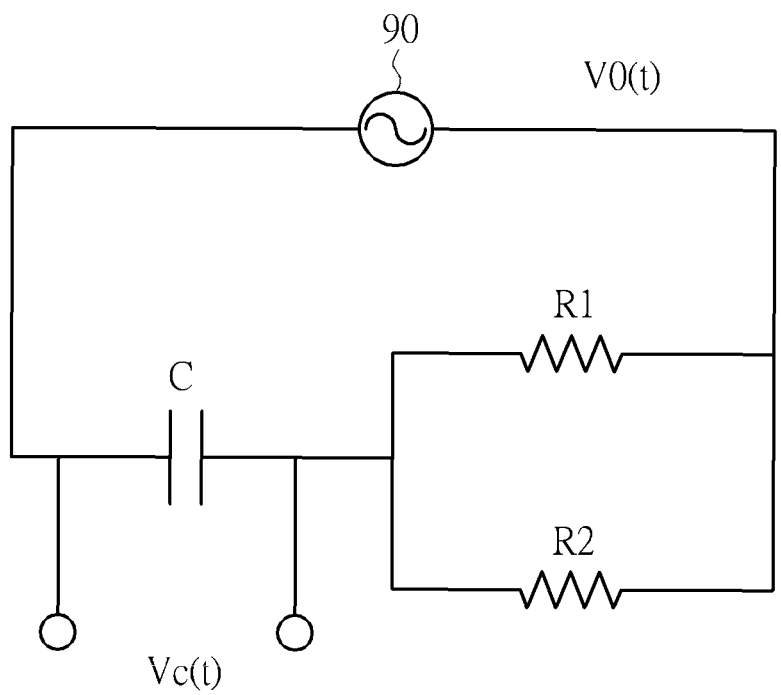
FIG. 5 is a schematic diagram illustrating an equivalent circuit in the test structure for electron beam inspection according to the second embodiment of the present invention.
Figure 6:
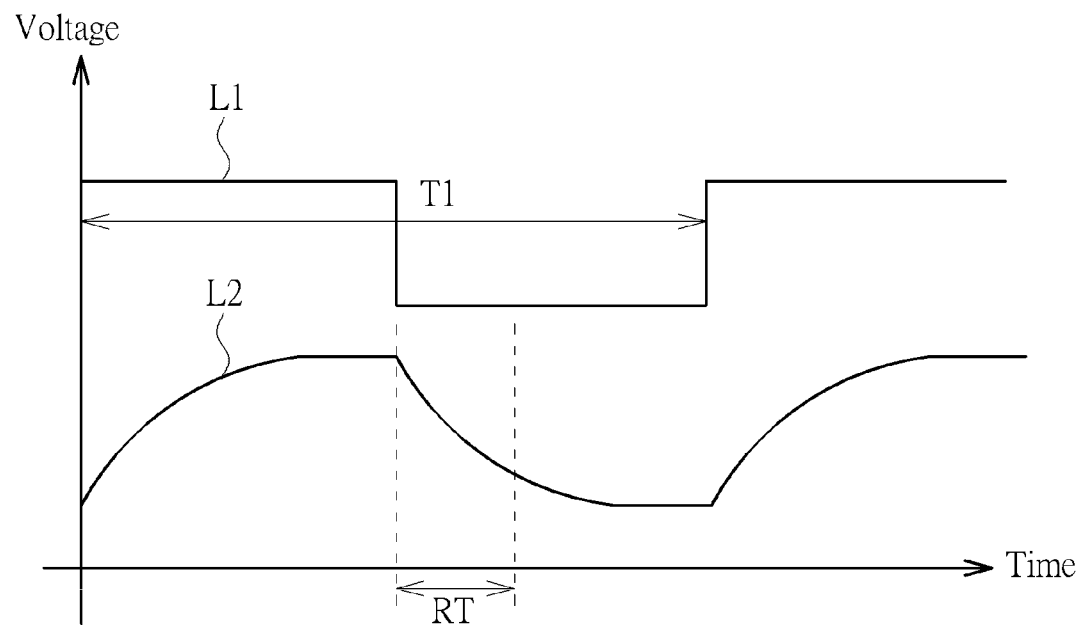
FIG. 6 is a schematic diagram illustrating a relation between an AC signal from an AC signal source and a received signal from a detector according to the second embodiment of the present invention.

Please refer to FIGS. 3-6. FIG. 3 is a flow chart of a method for defect determination using electron beam inspection according to a second embodiment of the present invention. FIG. 4 is a schematic drawing illustrating the method for defect determination using the electron beam inspection in this embodiment. FIG. 5 is a schematic diagram illustrating an equivalent circuit in the test structure for the electron beam inspection in this embodiment. FIG. 6 is a schematic diagram illustrating a relation between an AC signal from an AC signal source and a received signal from the detector in this embodiment. The method for defect determination using the electron beam inspection in this embodiment includes the following steps. As shown in FIG. 3 and FIG. 4, the test structure TS is provided. The structure and characteristics of the test structure TS have been detailed in the first embodiment and will not be redundantly described. In step S11, alternating current (AC) signals are applied to the semiconductor substrate 10 of the test structure TS by an AC signal source 90. In step S12, an electron beam inspection is performed to the test structure TS with an instance detector (such as the detector 200 shown in FIG. 4) and a lock-in amplifier 300. In this embodiment, an electron beam EB is used to apply negative charges on the surface of the test structure TS, and the detector 200 is operated instantly to receive signals at sites corresponding to each of the conductive regions 20 for at least a specific period of time, such as 1-50 seconds, but not limited thereto. In step S13, the signals received by the detector 200 within the period of time are amplified by the lock-in amplifier 300 instantly also.

Accordingly, a defect in the test structure TS may be determined by monitoring the signals received by the detector 200 and amplified by the lock-in amplifier 300. As shown in FIG. 4 and FIG. 5, a first resistance R1 may represent the connection resistance between the connection structure 40 and the left conductive region 20 in FIG. 4, a second resistance R2 may represent the connection resistance between the connection structure 40 and the right conductive region 20 in FIG. 4, and a capacitance may be formed by the cap dielectric layer 50 sandwiched by the connection structure 40 and the negative charges formed on the surface of the test structure TS. As shown in FIG. 4 and FIG. 6, a first line L1 represents the AC signal applied to the substrate 10, and a second line L2 represents the signals received by the detector 200 and amplified by the lock-in amplifier 300. As shown in FIGS. 4-6, the signals received by the detector 200 (such as a received signal Vc(t) shown in FIG. 5) may be amplified by the lock-in amplifier 300 according to a period (such as a first period T1 shown in FIG. 6) or a frequency (1/T1) of the AC signals V0(t). Specifically, the lock-in amplifier 300 may amplify the signal by a frequency substantially equal to the frequency of the AC signals V0(t), but not limited thereto. Accordingly, when an electrical short or open happens in the circuit between the connection structure 40 and the conductive region 20, the first resistance R1 and/or the second resistance R2 may increase, and the shape of the second line L2 may be different. Specifically, a relaxation time RT of the signals received by the detector 200 may be defined as the time required for the received signal Vc(t) to return a value of a predetermined percentage of its peak value (such as 10% of the peak value, but not limited thereto) from the peak value, and the relaxation time RT may increase when an electrical short or open happens in the circuit between the connection structure 40 and the conductive region 20. Accordingly, the defect in the test structure TS may be determined when the relaxation time RT of the signals received by the detector 200 and amplified by the lock-in amplifier 300 increases. Therefore, by using the method of this embodiment, the relaxation time RT may be used as an additional index for judging the defect in the test structure TS, and the S/N ratio may be enhanced by screening out noise with the lock-in amplifier 300.

Figure 7:
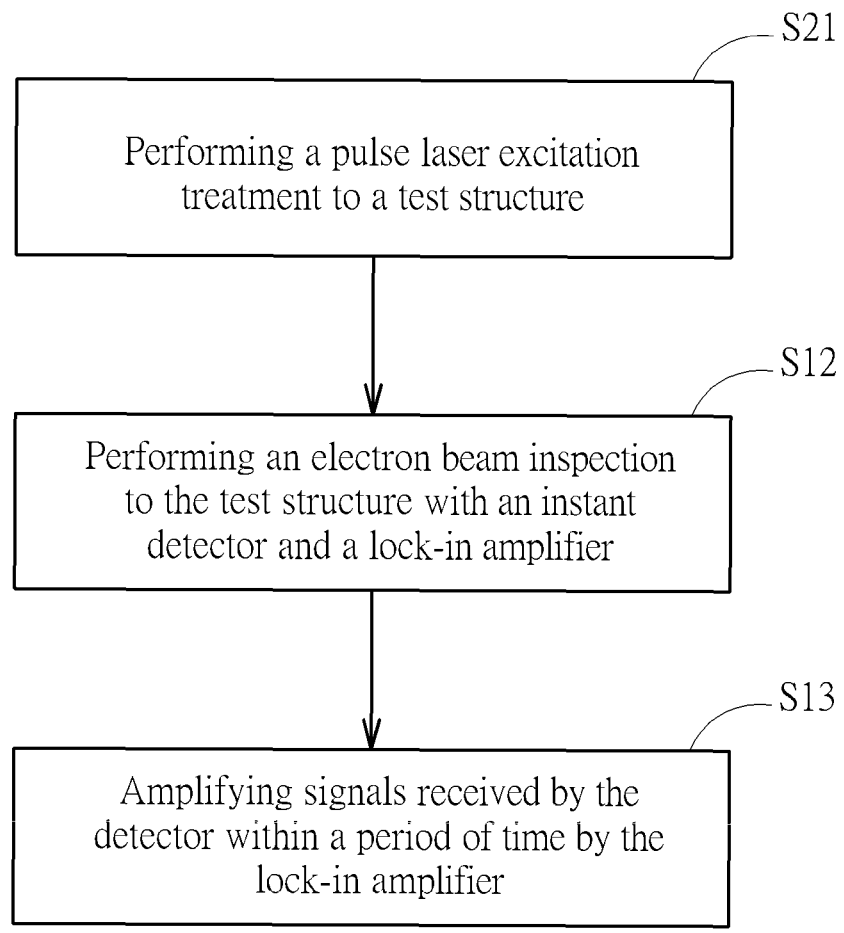
FIG. 7 is a flow chart of a method for defect determination using electron beam inspection according to a third embodiment of the present invention.
Figure 8:
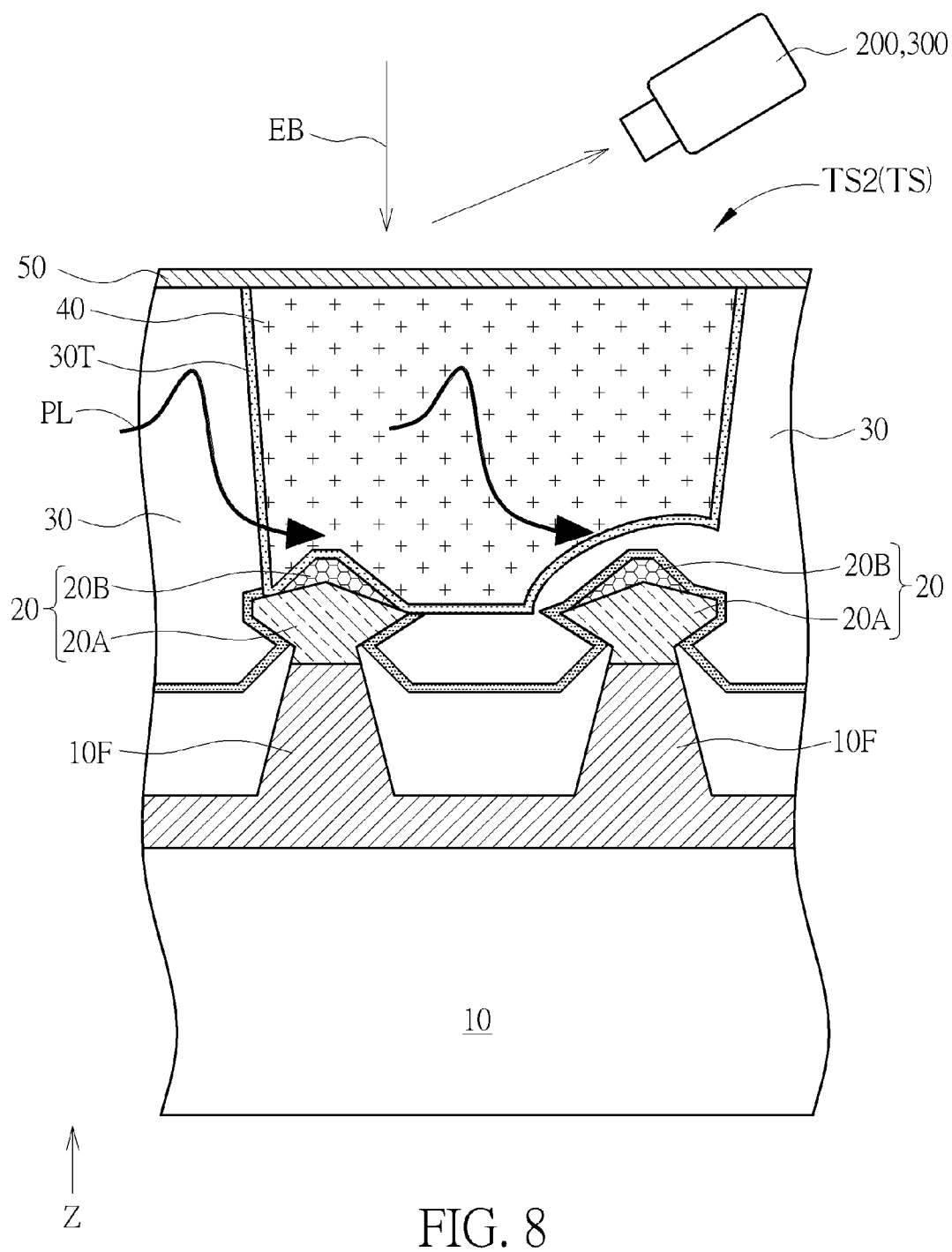
FIG. 8 is a schematic drawing illustrating the method for defect determination using the electron beam inspection according to the third embodiment of the present invention.
Figure 9:
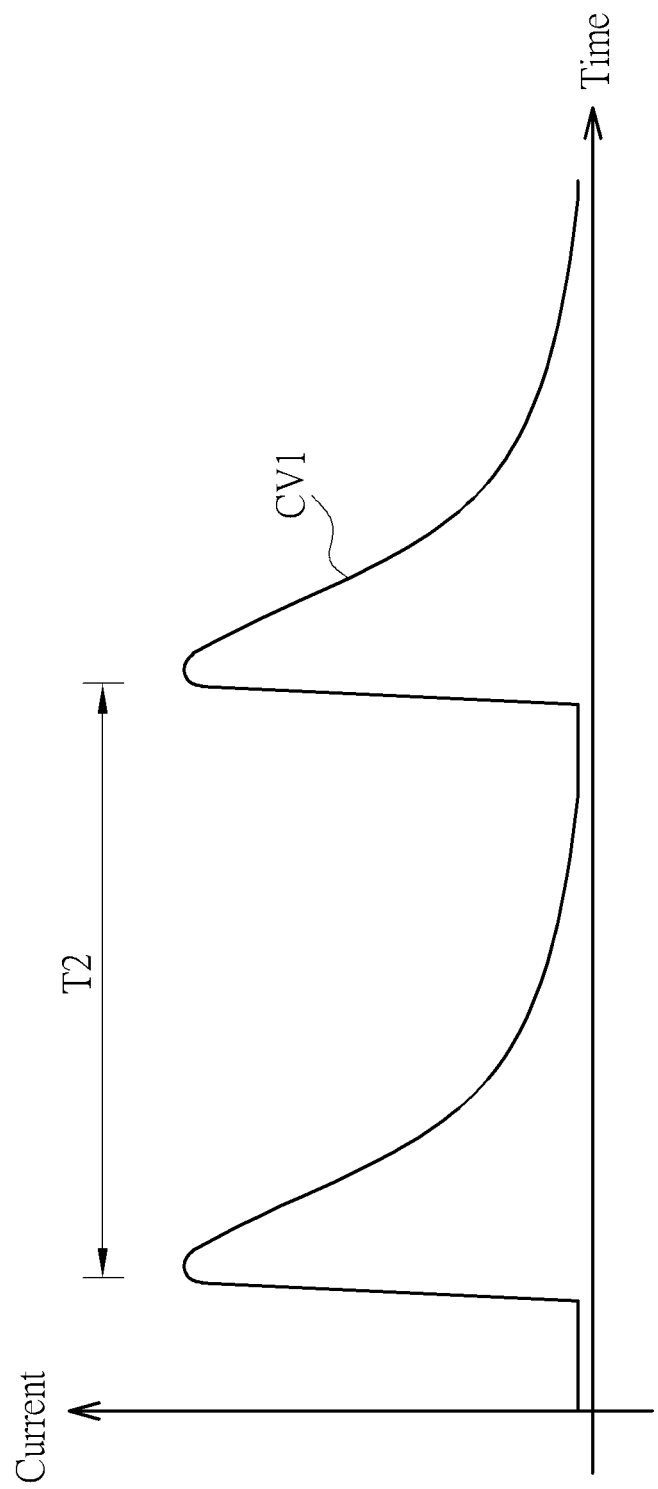
FIG. 9 is a schematic diagram illustrating a current signal excited by a pulse laser according to the third embodiment of the present invention.
Figure 10:
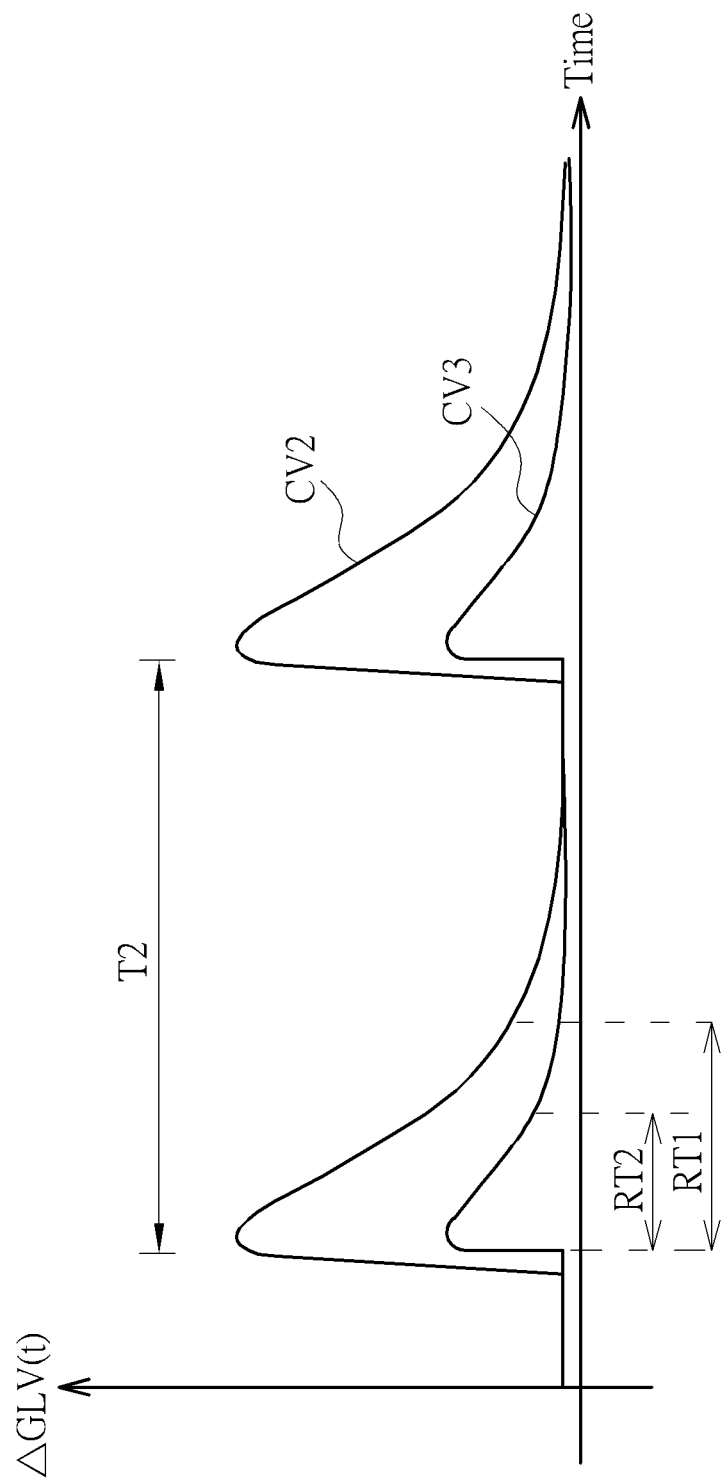
FIG. 10 is a schematic diagram illustrating a comparison in gray level value differences between a signal received from a normal sample and a signal received from an abnormal sample according to the third embodiment of the present invention.

Please refer to FIGS. 7-10. FIG. 7 is a flow chart of a method for defect determination using electron beam inspection according to a third embodiment of the present invention. FIG. 8 is a schematic drawing illustrating the method for defect determination using the electron beam inspection in this embodiment. FIG. 9 is a schematic diagram illustrating a current signal excited by a pulse laser in this embodiment. FIG. 10 is a schematic diagram illustrating a comparison in gray level value differences between a signal received from a normal sample and a signal received from an abnormal sample. The method for defect determination using the electron beam inspection in this embodiment includes the following steps. As shown in FIG. 7 and FIG. 8, the test structure TS is provided. In step S21, a pulse laser excitation treatment is performed to the test structure TS. In step S12, an electron beam inspection is performed to the test structure TS with an instance detector (such as the detector 200 shown in FIG. 7) and the lock-in amplifier 300. In this embodiment, the pulse laser excitation treatment may be performed to the test structure TS during the electron beam inspection preferably. In the electron beam inspection, an electron beam EB is used to apply negative charges on the surface of the test structure TS, and the detector 200 is operated instantly to receive signals at sites corresponding to each of the conductive regions 20 for at least a specific period of time. In step S13, the signals received by the detector 200 within the period of time are amplified by the lock-in amplifier 300 instantly also.

As shown in FIG. 8 and FIG. 9, a first curve CV1 may represent a current excited and/or induced in the test structure TS by a pulse laser PL of the pulse laser excitation treatment. A pulse wave of the pulse laser PL may has a period, and the current excited by the pulse laser PL may have the same period (such as a second period T2 shown in FIG. 9). Accordingly, a defect in the test structure TS may be determined by monitoring the signals received by the detector 200 and amplified by the lock-in amplifier 300. As shown in FIG. 8 and FIG. 10, a second curve CV2 represents a gray level value difference by time ΔGLV(t) of a signal received from a normal sample (such as the normal test structure TS1 shown in FIG. 1) and amplified by the lock-in amplifier 300 according to the period of the pulse laser PL (such as the second period T2 shown in FIG. 10), and a third curve CV3 represents a gray level value difference by time ΔGLV(t) of a signal received from an abnormal sample (such as the abnormal test structure TS2 shown in FIG. 8) and amplified by the lock-in amplifier 300 according to the second period T2 of the pulse laser PL. In other words, the signals received by the detector 200 are amplified by the lock-in amplifier according to the period of the pulse laser PL used in the pulse laser excitation treatment. In this embodiment, the gray level value difference ΔGLV is defined as the signal difference between the condition with the pulse laser excitation treatment and the condition without the pulse laser excitation treatment.

As shown in FIG. 8 and FIG. 10, the gray level value difference will become smaller when an electrical short or open happens in the circuit between the connection structure 40 and the conductive region 20. The defect in the test structure TS may be determined accordingly. In addition, a second relaxation time RT2 of the abnormal sample is also shorter than a first relaxation time RT1 of the normal sample. In other words, the relaxation time of the signals received by the detector 200 and amplified by the lock-in amplifier 300 may decrease when an electrical short or open happens in the circuit between the connection structure 40 and the conductive region 20. Accordingly, the defect in the test structure TS may also be determined when a relaxation time of the signals received by the detector 200 and amplified by the lock-in amplifier 300 decreases. In the method of this embodiment, the S/N ratio may be enhanced by amplifying the received signals according to the period of the pulse laser PL used in the pulse laser excitation treatment and screening out noise with the lock-in amplifier 300. Additionally, the relaxation time may also be used as an additional index for judging the defect in the test structure TS.

It is worth noting that the method described in the second embodiment and the method described in the third embodiment may also be used to determine the exact site of the defect (such as an open between the connection structure 40 and the right conductive region 20 shown in FIG. 4 and FIG. 8) because the detector 200 may be operated instantly to receive signals at sites corresponding to each of the conductive regions 20 for at least a specific period of time. The preciseness of the electron beam inspection may be enhanced accordingly.

To summarize the above descriptions, in the test structure for the electron beam inspection in the present invention, the cap dielectric layer is disposed on the connection structure connecting over the conductive regions for forming a capacitance, and the capacitance may be used in the electron beam inspection for improving the S/N ratio and the accuracy of the electron beam inspection. In the method for defect determination using the electron beam inspection in the present invention, the signals received by the detector within a period of time are amplified by the lock-in amplifier according to the period of the AC signal applied to the semiconductor substrate of the test structure or the period of the pulse laser applied to the test structure. The signal-to-noise ratio and the accuracy of the electron beam inspection may be enhanced accordingly, and the relaxation time of the received signal may be used as an additional index for judging the defect in the test structure.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A test structure for electron beam inspection, comprising:
   a semiconductor substrate;
   at least two conductive regions disposed on the semiconductor substrate;
   a connection structure disposed on the two conductive regions; and
   a cap dielectric layer disposed on the connection structure.

2. The test structure for electron beam inspection according to claim 1, wherein each of the two conductive regions comprises a doped region on a fin structure.

3. The test structure for electron beam inspection according to claim 2, wherein each of the two conductive regions further comprises a metal silicide disposed on the doped region.

4. The test structure for electron beam inspection according to claim 1, wherein the connection structure is a slot contact disposed in a dielectric layer.

* * * * *